United States Patent [19]
Yukinori et al.

[11] Patent Number: 5,789,912
[45] Date of Patent: Aug. 4, 1998

[54] HIGH FREQUENCY SWITCH AND METHOD OF TESTING H-F APPARATUS

[75] Inventors: Miyake Yukinori; Kaneko Mitsunori; Masuzaki Yasuhiro; Ozaki Tetsuya, all of Tokyo, Japan

[73] Assignee: Hirose Electric Co., Ltd., Tokyo, Japan

[21] Appl. No.: 795,863

[22] Filed: Feb. 6, 1997

Related U.S. Application Data

[62] Division of Ser. No. 428,553, Apr. 25, 1995, Pat. No. 5,625,177.

[30] Foreign Application Priority Data

Mar. 30, 1995 [JP] Japan ................................. 7-44397

[51] Int. Cl.⁶ .................................................. G01R 31/02
[52] U.S. Cl. .......................... 324/73.1; 324/755; 429/188
[58] Field of Search .............................. 324/73.1, 72.5, 324/755; 200/51.09, 1 R; 439/188

[56] References Cited

U.S. PATENT DOCUMENTS

| | | | |
|---|---|---|---|
| 2,946,001 | 7/1960 | Russell | 324/77.5 |
| 3,496,464 | 2/1970 | Tankersley | 324/73.1 |
| 4,423,373 | 12/1983 | LeCroy | 324/72.5 |

FOREIGN PATENT DOCUMENTS 37-5053  3/1962  Japan .
2-42338  3/1990  Japan .

*Primary Examiner*—Ernest F. Karlsen
*Assistant Examiner*—Jose M. Solis
*Attorney, Agent, or Firm*—Kanesaka & Takeuchi

[57] ABSTRACT

A high frequency switch to be mounted on a board, which includes an insulating housing to be mounted on a board of a high frequency apparatus on which ground and signal conductors are disposed; a pair of parallel ground conductive plates disposed on opposite sides of the insulating housing in a direction perpendicular to the board such that when the insulating housing is mounted on the board, the ground plates are connected to the ground conductors on the board; an non-ground conductive plate disposed in the insulating housing between and at right angles with the parallel ground conductive plates such that when the insulating housing is mounted on the board, the non-ground conductive plate is connected to the signal conductor, the non-ground conductive plate including: a switching spring to be connected to one of the signal conductors on an input side, and a connection plate to be connected to one of the signal conductors on an output side; a free end of the switching spring being pressed against a free end of the connection plate by a spring force in a direction perpendicular to the board but, when a probe is inserted in a direction perpendicular to the board to depress the switching spring, the free end of the switching spring being separated from the free end of the connection plate so that incoming signals are transmitted to the probe from the one of the signal conductors on the input side.

4 Claims, 20 Drawing Sheets

HIGH FREQUENCY SWITCH AND METHOD OF TESTING H-F APPARATUS

CROSS-REFERENCES TO RELATED APPLICATIONS

This is a divisional application of Ser. No. 428,553 filed Apr. 25, 1995.

BACKGROUND OF THE INVENTION

1. Field of the Invention

The present invention relates to high frequency switches to be mounted on boards and methods of testing high frequency apparatus by means of such h-f switches.

2. Description of the Related Art

A conventional method of testing the performance of each of h-f circuits mounted on the same board includes the steps of cutting off signal conductor between the respective h-f circuits, picking up signals from the cut off portions for testing, and, after testing, filling the cut off portions with conductor for soldering. Another method includes putting earphone jack coaxial connectors in transmission lines to take signals for testing h-f circuits connected to the transmission lines. H-f switches are used to switch between built-in speakers and earphones or outside and inside antennas in the RF (coaxial) circuits of RF apparatus such as portable phones and BS or ordinary TV sets.

Such h-f switches includes a pair of parallel ground conductive plates and an non-ground conductive plate disposed between and at right angles with the parallel ground conductive plates to provide an impedance match. The switches are used to switch between two circuits A and B mounted in an apparatus without disturbing the impedance match. Consequently, it is necessary to mount two circuits (if one of them is open, then an open circuit) in the apparatus.

In addition, the outputs of the two circuits are made parallel to the board on which the h-f switch is mounted so that it is necessary to make a signal pick-up circuit to take a signal from one of the outputs or to mount the switch on an edge of the board thereby providing a large space around the output.

The above method in which the cut-off conductor portions are soldered after testing requires a large number of steps of operation. In the testing method in which an earphone jack coaxial connector is disposed on the transmission line, the coaxial connector lowers the impedance of a portion of the transmission line, causing an impedance mismatch and reflection at the connector. The connector is disposed on the transmission line without cutting the line so that it is impossible to pick up all of the signals because part of the signals still flow the transmission line.

Such problems with the above methods will be described more specifically with reference to FIGS. 1–3. In FIG. 1, an non-ground conductive plate 11a is disposed between and at right angles with parallel ground conductive plates 12a to provide an impedance match. It is known that even if the non-ground conductive plate 11a is bent as shown by broken lines, the impedance match is maintained. However, as shown in FIG. 2, when the ground conductive plates 21a are disposed in parallel to the board 23a or, as shown in FIG. 3, when the ground conductive plates 31a are disposed in perpendicular to the board, the output directions of circuits A and B are parallel to the board 23a or 33a.

That is, as shown in FIG. 4, when such a h-f switch 41a is mounted on a board 42a, the output directions of circuits A and B are parallel to the board 42a. Where the output of circuit A is a transmission line for supplying signals and signals are taken out from the output of circuit B, it is necessary to provide either a signal pick-up circuit matched to the output of the circuit B or a large space around the circuit B at the expense of other components. In addition, it is very hard to take out a signal in the direction of B or parallel to the board 42a.

In order to avoid such a problem, as shown in FIG. 5, an h-f switch 51a is mounted on an edge of a board 52a. However, this puts limits to the location of an h-f switch and makes it impossible to test all of the h-f circuits.

As shown in FIG. 6, where a coaxial connector 61a is put on a h-f transmission line 62a an impedance mismatch occurs at the location of the coaxial connector 61a, causing reflection at the location of the coaxial connector 61a. The value of transmitted signals N is equal to the value of (transmitting signals L—reflected signals R) so that the value of N decreases as the frequency or power increases.

Where signals are taken out from the coaxial connector 61a in the direction perpendicular to the board 62a, most of the transmitting signals L are transmitted as the transmitted signals N so that the value of picked-up signals M is very low. The value of the picked-up signals M also decreases as the frequency or power increases.

SUMMARY OF THE INVENTION

Accordingly, it is an object of the invention to provide a h-f switch to be mounted on a board, which is free from the aforementioned problems.

It is another object of the invention to provide a low profile h-f switch to be mounted on a board.

It is still another object of the invention to provide a method of testing the performance of each of h-f circuits.

According to the invention it is discovered that the above problems, are solved by a h-f switch constructed according to the operational principle shown in FIG. 7. That is, a non-ground conductive member 72a is made up of a circuit A for picking up signals in the direction parallel to the board 73a and a circuit B for picking up signals in the direction perpendicular to the board 73a. As shown in FIG. 8, since the circuit B permits picking up signals in the direction perpendicular to the board 81a wherever the switch 81a is disposed on the board 82a, it is possible to not only reduce the space for picking up signals from the transmission line but also increase the productivity.

According to one aspect of the invention there is provided a high frequency switch to be mounted on a board, which includes an insulating housing to be mounted on a board of a high frequency apparatus on which ground and signal conductors are disposed; a pair of parallel ground conductive plates disposed on opposite sides of the insulating housing in a direction perpendicular to the board such that when the insulating housing is mounted on the board, the ground plates are connected to the ground conductors on the board; an non-ground conductive plate disposed in the insulating housing between and at right angles with the parallel ground conductive plates such that when the insulating housing is mounted on the board, the non-ground conductive plate is connected to the signal conductor, the non-ground conductive plate including: a switching spring to be connected to one of the signal conductors on an input side, and a connection plate to be connected to one of the signal conductors on an output side; a free end of the switching spring being pressed against a free end of the connection plate by a spring force in a direction perpendicular to the board but, when a probe is inserted in a direction perpendicular to the board to depress the switching spring, the free end of the switching spring being separated from the free end of the connection plate so that incoming signals are transmitted to the probe from the one of the signal conductors on the input side.

According to another aspect of the invention there is provided a high frequency switch to be mounted on a board, which includes an insulating housing to be mounted on a board of a high frequency apparatus on which ground and signal conductors are disposed; a pair of parallel ground conductive plates disposed on opposite sides of the insulating housing in a direction perpendicular to the board such that when the insulating housing is mounted on the board, the ground plates are connected to the ground conductors; an non-ground conductive plate disposed in the insulating housing between and at right angles with the parallel ground conductive plates such that when the insulating housing is mounted on the board, the non-ground conductive plate is connected to the signal conductor, the non-ground conductive plate including: an intermediate plate; a first switching spring to be connected to one of the signal conductors on one side, and a second switching spring to be connected to another of the signal conductors on the other side, free ends of the first and second switching springs being pressed against free ends of the intermediate connection plate by spring forces in a direction perpendicular to the board but, when a probe is inserted in a direction perpendicular to the board to depress one of the first and second switching springs, the free end of the one of the switching springs being separated from one of the free ends of the connection plate so that incoming signals are transmitted to the probe from the one of the switching springs.

According to still another aspect of the invention there is provided a high-frequency switch to be mounted on a board of a high frequency apparatus on which ground and signal conductors are disposed on an upper surface and a conductive plane disposed on a lower surface, which includes an insulating housing to be mounted on the board; a pair of parallel ground conductive plates disposed on opposite sides of the insulating housing such that when the insulating housing is mounted on the board, the ground conductive plates are perpendicular to the board and connected to the ground conductors; a non-ground conductive plate disposed in the insulating housing between and at right angles with the parallel ground conductive plates such that when the insulating housing is mounted on the board, the non-ground conductive plate is connected to the signal conductors, the non-ground conductive plate including: a connection plate to be connected to one of the signal conductors on an output side and having a free contact end portion; and a switching spring to be connected to one of the signal conductors on an input side and having a free spring contact end portion for spring contact with the free contact end portion of the connection palate so as to form a side edge transmission line together with the ground conductive plates but, when a probe is inserted in a direction normal to the board to separate the free spring contact end portion from the free contact end portion of the connection plate, it forms a microstrip or coplanar guide transmission line together with the conductive plane.

According to yet another aspect of the invention there is provided a method of testing a performance of each of high frequency circuits made on a board of a high frequency apparatus, which includes the steps of providing in at least one of the high frequency circuits a high frequency switch having a non-ground conductive plate which is switched between a first condition under which a signal is picked up in a direction parallel to the board and a second condition under which a signal is picked up in a direction perpendicular to the board and switching the high frequency switch to the second condition for testing a performance of the one of high frequency circuits and, after testing, to the first condition.

The preferred high frequency switches used in the above method is one of high frequency switches made according to the first, second, and third aspects of the invention.

The other objects, features, and advantages of the invention will be more apparent from the following description when taken in conjunction with the accompanying drawings.

DESCRIPTION OF THE PREFERRED EMBODIMENTS

Figure 1:
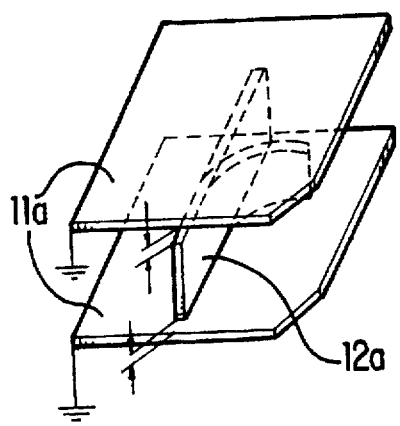
FIG. 1 is a perspective view showing the operational principle of a h-f switch.
Figure 2:
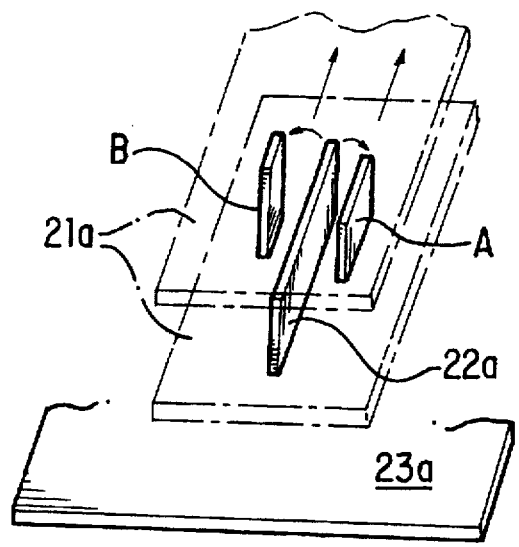
FIG. 2 is a perspective view of a conventional h-f switch.
Figure 3:
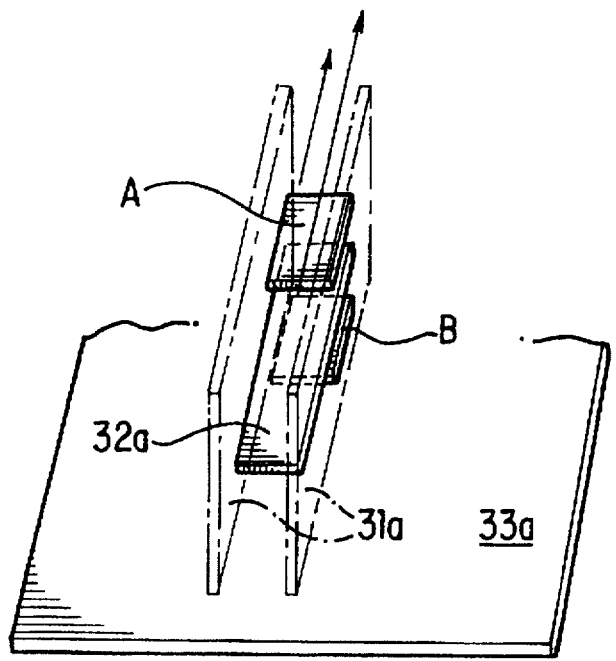
FIG. 3 is a perspective view of another conventional h-f switch.
Figure 4:
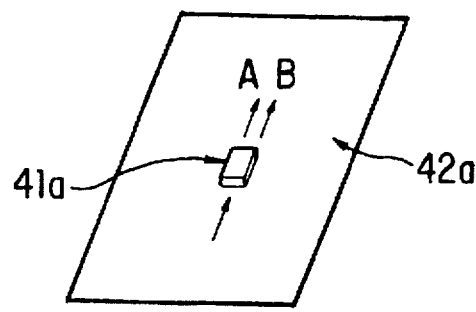
FIG. 4 is a perspective view for showing the signal output relative to the location of a h-f switch on the board.
Figure 5:
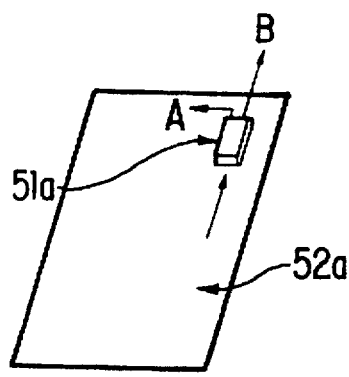
FIG. 5 is a perspective view for showing the signal outputs relative to the location of a h-f switch on the board.
Figure 6:
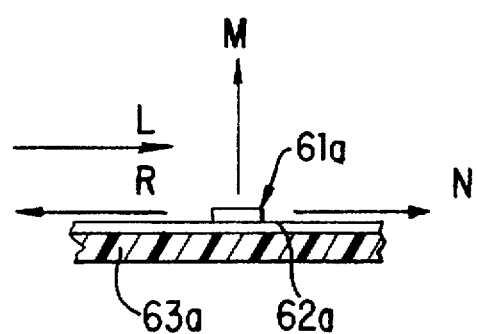
FIG. 6 is a side view of still another conventional h-f switch.
Figure 7:
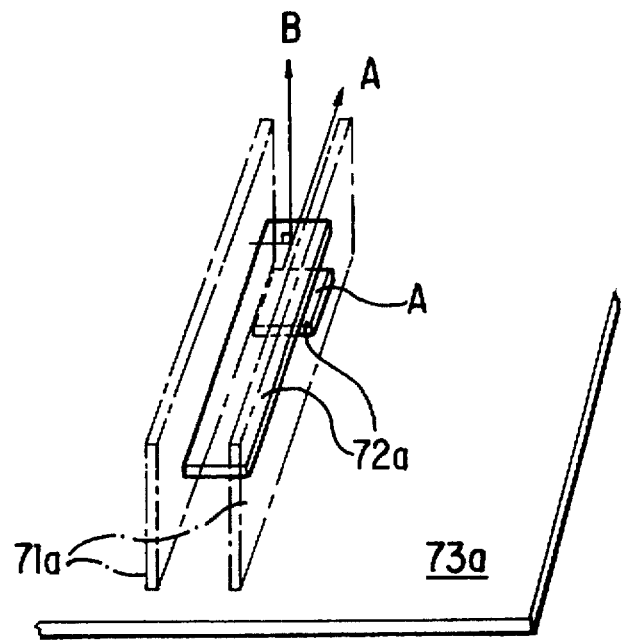
FIG. 7 is a perspective view for showing the operational principle of a h-f switch according to the invention.
Figure 8:
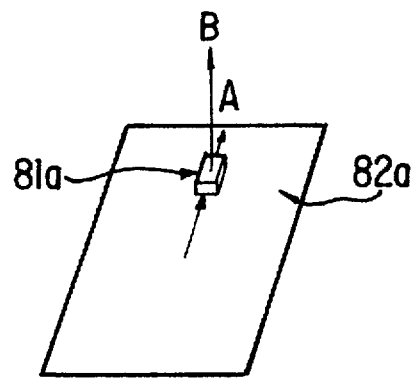
FIG. 8 is a perspective view for showing the signal outputs relative to the location of a h-f switch according to the invention.
Figure 9:
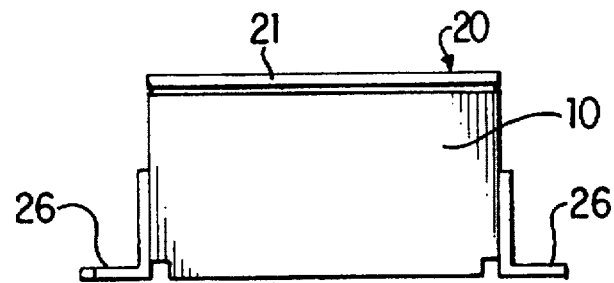
FIG. 9 is a side elevational view of a h-f switch to be mounted on a board according to an embodiment of the invention.
Figure 10:
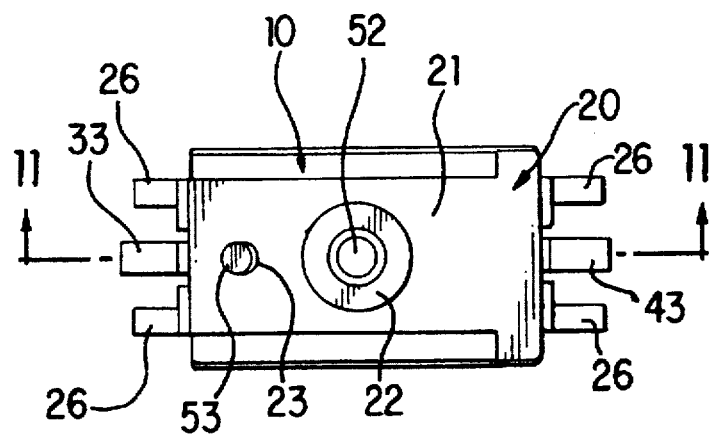
FIG. 10 is a top plan view of the h-f switch.

In FIGS. 9–12, a h-f switch includes an insulation housing 10, a ground plate 20 attached to the insulation housing 10, a connection plate 30, a switching spring 40, and a terminal holding cover 50.

Figure 13:
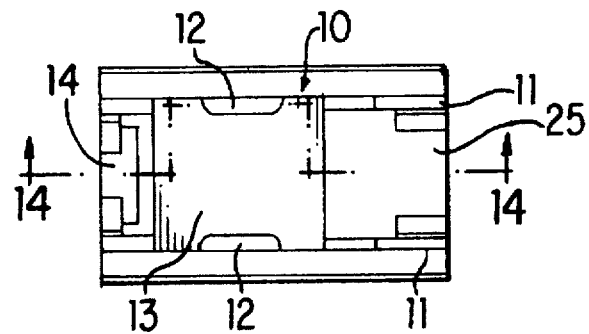
FIG. 13 is a top plan view of an insulation housing for the h-f switch.
Figure 14:
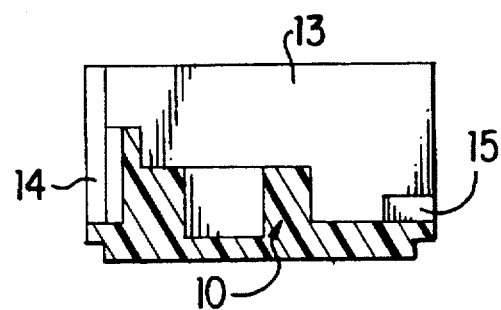
FIG. 14 is a sectional view taken along line 14—14 of FIG. 13.

In FIGS. 13 and 14, the insulation housing 10 is molded from a plastic material to provide a channel-like structure having an upper opening. A pair of grooves 11 are provided on opposite lower sides of the housing 10 for receiving leg portions of the ground plate 20. A retention recess 12 is provided at the center of each groove 11 for receiving a latch claw of the ground plate 20. A cavity 13 of the housing 10 receives the connection plate 30 and the switching spring 40. A retention channel 14 and a retention recess 15 are provided at the center of the left wall and the center of the right wall of the housing 10 for receiving a pair of retention legs of the terminal holding cover 50, respectively.

Figure 15:
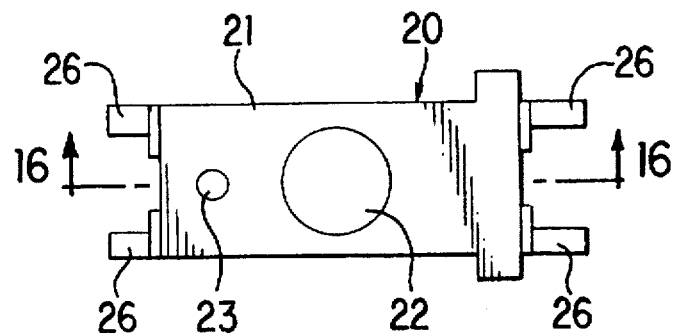
FIG. 15 is a top plan view of a ground plate for the h-f switch.
Figure 16:
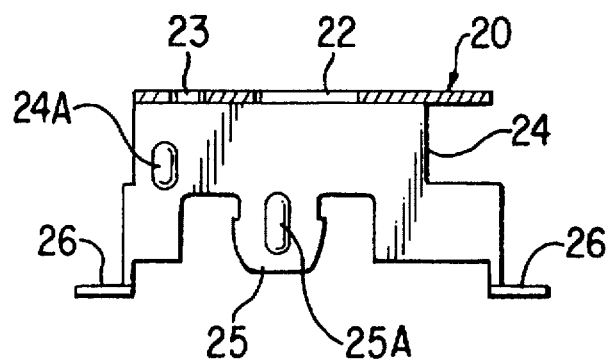
FIG. 16 is a sectional view taken along line 16—16 of FIG. 15.

In FIGS. 15 and 16, the ground plate 20 is made by stamping and forming a conductive metal sheet such that it has a ceiling portion 21 and a pair of parallel wall portions 24 extending downwardly from opposite sides of the ceiling portion 21. Provided on the ceiling portion 21 are a circular hole 22 for receiving a probe and a retention hole 23 for receiving an engaging projection of the terminal holding cover 50. A pair of leg portions 25 extend downwardly from center sections of the wall portions 24 for engagement with the latch recesses 12 of the housing 10. A pair of connection terminals 26 extends laterally from opposite lower ends of each wall portion 24 for connection with ground conductors of a board. Inward projections 25A and 24A are provided at the center of each leg portion 25 and the left section of each wall portion 24 for engagement with the latch recess 12 of the housing 10 and the leg portion of the terminal holding cover 50, respectively.

Figure 17:
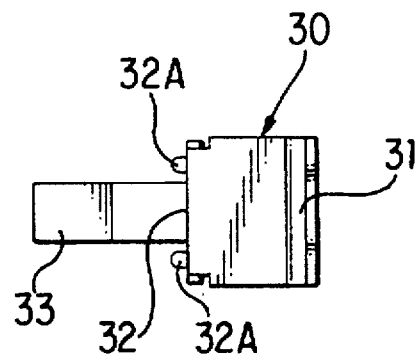
FIG. 17 is a top plan view of a connection plate for the h-f switch.
Figure 18:
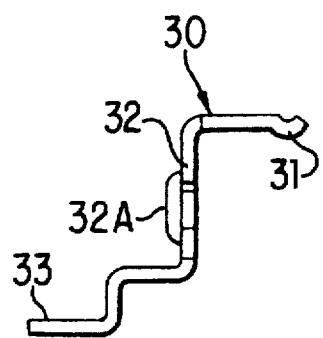
FIG. 18 is a side elevational view of the connection plate.

In FIGS. 17 and 18, the connection plate 30 is made by stamping and forming a conductive metal sheet. It is a part of a non-ground conductive plate and has a contact portion 31 for contact with a contact portion of the switching spring 40 and a middle portion 32 extending downwardly from the contact portion 31. A connection terminal 33 extends laterally from the middle portion 32 for connection to a signal conductor on the board. A pair of outward projections 32A are provided on opposite sides of the middle portion 32 with an interval sufficiently large to receive the retention leg of the terminal holding cover 50 between them.

Figure 19:
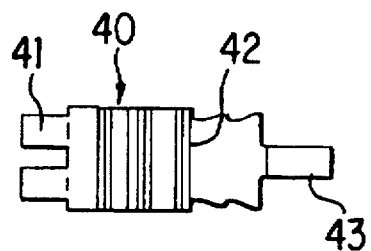
FIG. 19 is a top plan view of a switching spring for the h-f switch.
Figure 20:
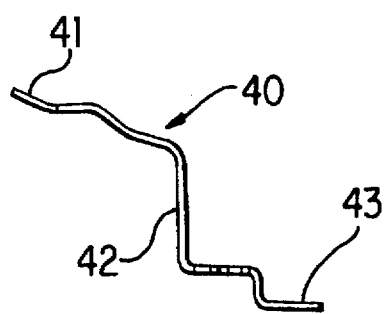
FIG. 20 is a side elevational view of the switching spring.

In FIGS. 19 and 20, the switching spring 40 is made by stamping and forming a springy and conductive metal sheet. It is a part of the non-ground conductive plate and has a contact portion 41 for contact with the contact portion 31 of the connection plate 30 and a middle portion 42 extending downwardly from the contact portion 41. A connection terminal 43 extends laterally from the middle portion 42 for connection to a signal conductor on the board.

Figure 21:
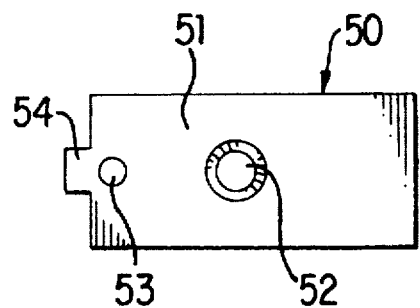
FIG. 21 is a top plan view of a terminal holding cover for the h-f switch.
Figure 22:
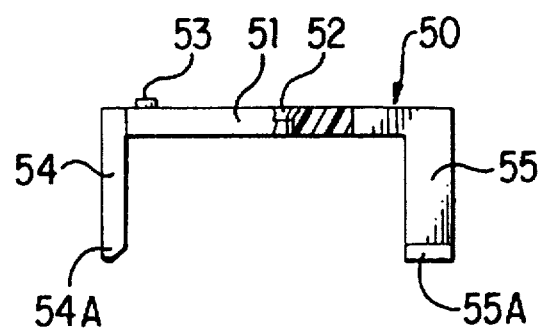
FIG. 22 is a partially cutaway side elevational view of the terminal holding cover.

In FIGS. 21 and 22, the terminal holding cover 50 is made from a plastic material such that it has a ceiling portion 51 and a pair of leg portions 54 and 55 extending downwardly from opposite ends of the ceiling portion 51. A circular hole 52 is provided on the ceiling portion 51 in alignment with the circular hole 22 of the ground plate 20 for receiving a probe. Also, an engaging projection 53 is provided on the ceiling portion 51 for engagement with the engaging hole 23 of the ground plate 20. Lower ends 54A and 55A of the leg portions 54 and 55 engage the retention channel 14 and the retention recess 15 of the housing 10, respectively.

Figure 11:
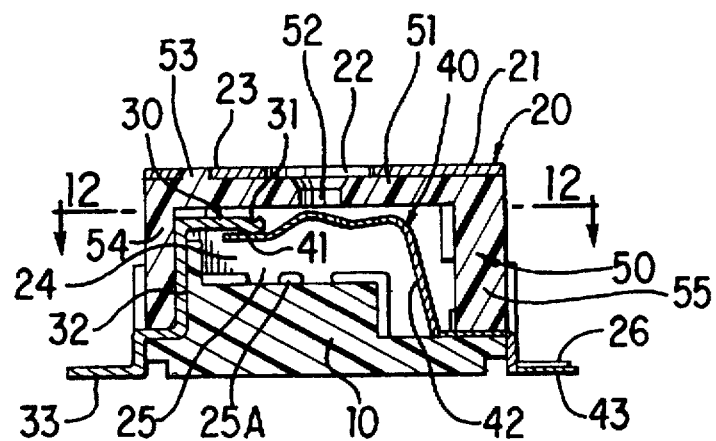
FIG. 11 is a sectional view taken along line 11—11 of FIG. 10.
Figure 12:
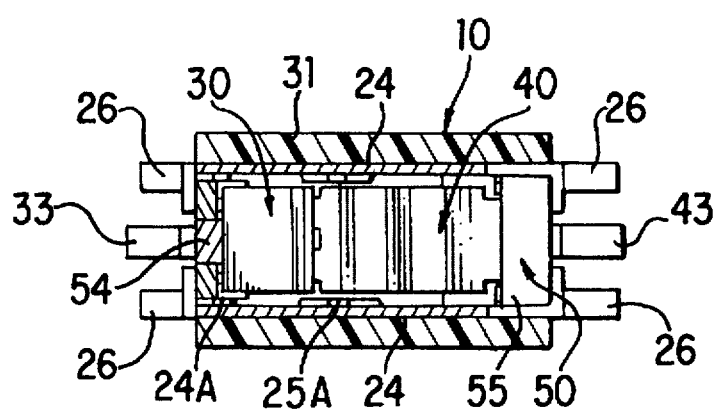
FIG. 12 is a sectional view taken along line 12—12 of FIG. 11.

How to assemble such a h-f switch will be described with reference to FIG. 11. First of all, the connection plate 30 and the switching spring 40 are attached to the housing 10 such that the contact portio 41 of the switching spring 40 is in spring contact with the lower surface of the contact portion 31 of the connection plate 30. Then, the terminal holding cover 50 is attached to provide a cover-housing assembly such that the lower end portions 54A and 55A of the leg portions 54 and 55 engage the retention recesses 14 and 15 of the housing 10, respectively. Consequently, the connection terminals 33 of connection plate 30 and switching spring 40 are held between the lower end portions 54A and 55A of the terminal holding cover 50 and the housing 10, respectively.

Then, the ground plate 20 is attached to the cover-housing assembly so that the leg portions 25 engage the retention recesses 12 of the housing 10 while the engaging projection 53 of the terminal holding cover 50 engages the engaging hole 23 of the ground plate 20. Consequently, the ceiling portion 21 of the ground plate 20 is pressed against the ceiling portion of the terminal holding cover 50 thereby securing the connection plate 30 and the switching spring 40 to the insulation housing 10.

Normally, the contact portion 31 of the connection plate 30 is in contact with the contact portion 41 of the switching spring 40 so that signals are transmitted from the connection terminal 43 to the connection terminal 33. When a probe is inserted through the aligned circular holes 22 and 52 of ground plate 20 and terminal holding cover 50, it depresses downwardly the contact portion 41 of the switching spring 40 to separate it from the contact portion 31 of connection plate 30 so that signals are transmitted from the connection terminal 43 to the probe. When the probe is removed, the contact portion 41 returns with its spring force to the original condition under which it is in spring contact with the contact portion 31 of the connection plate 30.

Figure 23:
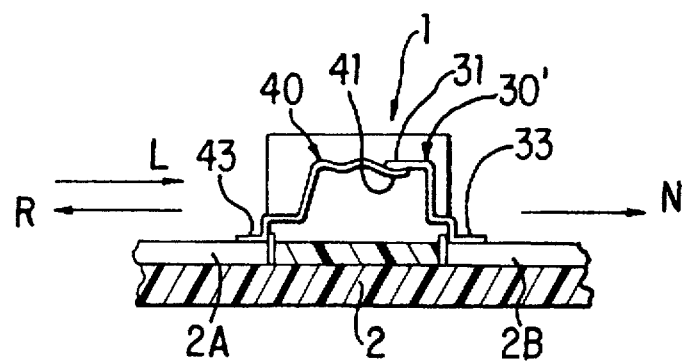
FIG. 23 is a side view, partially in section, of the h-f switch mounted in a h-f apparatus.

How to use such a h-f switch will be described below with reference to FIGS. 23 and 24. In FIG. 23, the h-f switch 1 is mounted between an output conductor 2A of an input side h-f circuit and an input conductor 2B of an output side h-f circuit on the board 2 of a h-f apparatus. The connection terminal 43 and 33 of switching spring 40 and connection plate 30 are soldered to the signal conductors 2A and 2B, respectively. Similarly, the connection terminals 26 of the ground plate 20 are soldered to ground conductors of the board 2.

The h-f switch has an impedance match in a signal transmission line from the signal conductor 2A to the signal conductor 2B which is made by the contact between the contact portions 41 and 31 of the switching spring 40 and the connection plate 30. Consequently, the value of reflected signals R is substantially zero, making the values of transmission signals L and N substantially equal.

Figure 24:
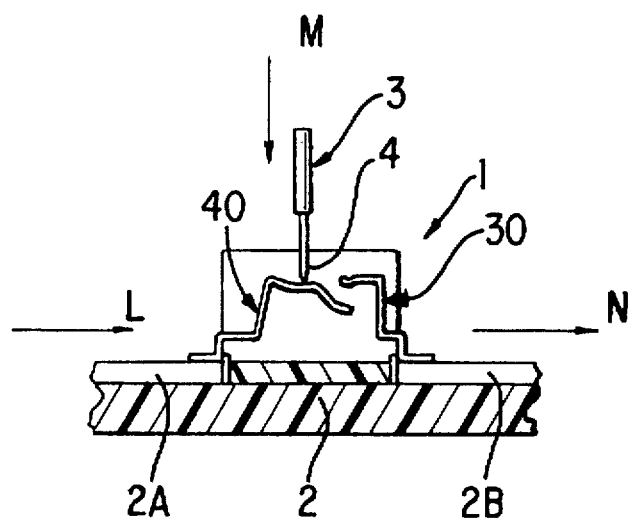
FIG. 24 is a side view, partially in section, of the h-f switch into which a probe is inserted.

In FIG. 24, a probe 3 is inserted through the circular holes 22 and 52 in the direction perpendicular to the board 2 to test the performance of the h-f circuits. The contact portion 4 of the probe 3 depresses the contact portion 41 of the switching spring 40 downwardly away from the contact portion 31 of the connection plate 30 so that signals are not transmitted from the signal conductor 2A to the signal conductor 2B. That is, under such a switching condition, the value of transmitted signals N is substantially zero. Consequently, the value of signals M picked-up through the switching spring 40 and the probe 3 is substantially equal to that of incoming signals L.

Figure 25:
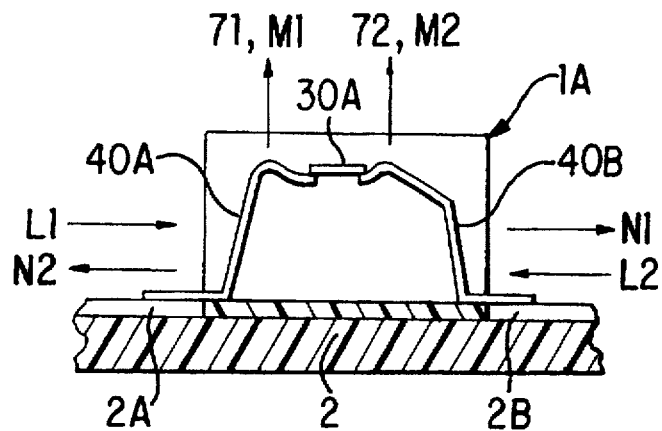
FIG. 25 is a side view, partially in section, of a h-f switch according to another embodiment of the invention.

In FIG. 25, the structural portions and functions of a h-f switch 1A are identical with or similar to those of FIGS. 9–24 and the description will be omitted. Unlike the h-f switch of FIGS. 1–16 where signals in only one direction are picked up, the h-f switch 1A makes it possible to pick up signals in two different directions; i.e., from L1 to N1 or from L2 to N2.

The h-f switch 1A includes first and second switching springs 40A and 40B connected to signal conductors 2A and 2B of a board 2, respectively, and an intermediate connection plate 30A. The first and second switching springs 40A and 40B are pressed against the intermediate connection plate 30A with spring forces. A pair of pick-up ports 1 and 2 are provided for the first and second switching springs 40A and 40B, respectively. The pick-up ports 1 and 2 have a similar structure to the openings 22 and 52 in the above embodiments, and details thereof are omitted.

If a transmission signal L1 is to be picked up, a probe is inserted into the pick-up port 71 while if a transmission signal L2 is to be picked up, the probe is inserted into the pick-up port 72.

According to the invention, a non-ground conductive plate is provided at right angles with the a pair of parallel ground plates to provide pick-up signals in the direction perpendicular to the board so that it is possible to pick-up signals at various points on the board without taking a large space.

When the h-f switches are mounted in transmission lines, the impedance of the transmission lines is not disturbed, and substantially all of the signals running in the transmission lines can be picked up. As a result, it is possible to measure and analyze accurately (to test circuits) signals that are too weak to pick up by the conventional methods. By the method of testing h-f apparatus using the h-f switch according to the invention, it is possible to test accurately each h-f circuit in a h-f apparatus without adding any special step of operation for testing.

Figure 26:
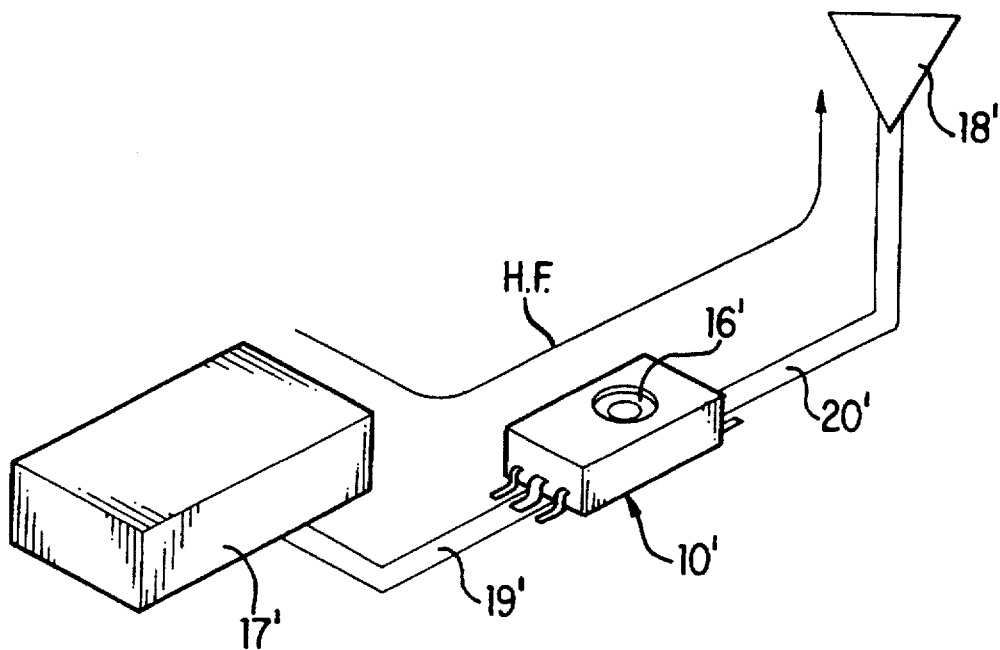
FIG. 26 is a perspective view showing how to use the h-f switch according to the invention.

As shown in FIG. 26, such a h-f switch 10' is used for the circuit of a h-f apparatus. For example, a h-f circuit module 17' of a portable phone is mounted on a circuit board. The h-f switch 10' is disposed between a signal conductor 19' connected to the h-f circuit module 17' and a signal conductor 20' connected to an antenna 18'. The connection terminals of the switching spring and the connection plate of the h-f switch 10' are soldered to the signal conductors 19' and 20', respectively. Similarly, the connection terminals of the ground plate are soldered to ground conductors (not shown) on the circuit board.

Under such a condition, the h-f switch 10' has an impedance match in a signal transmission line between the signal conductor 19' and the signal conductor 20' in the form of so-called side edge transmission line. As a result, the value of reflected signals at the h-f switch 10' is substantially zero so that the values of input and output signals at the signals conductors 19' and 20' are substantially equal.

Figure 27:
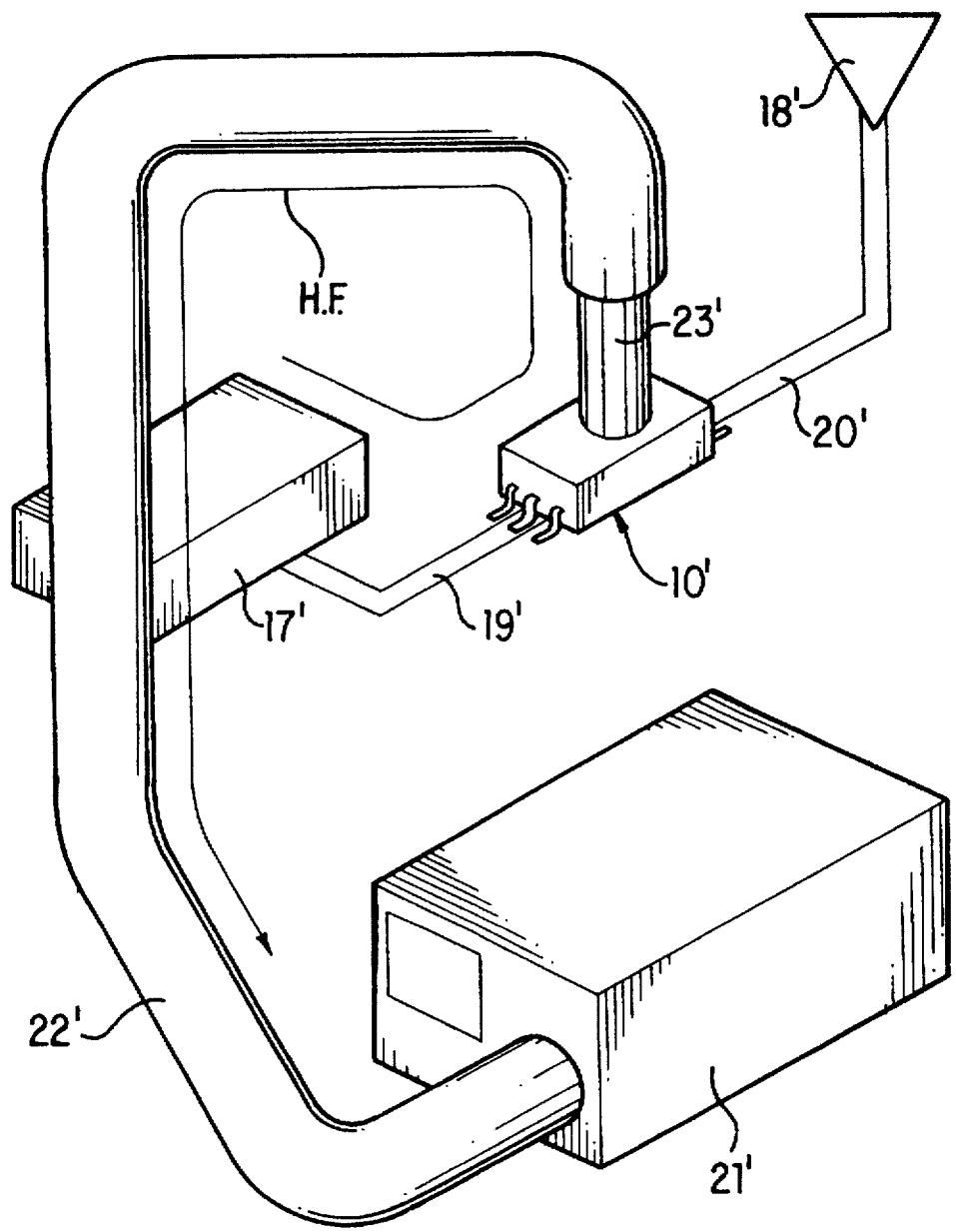
FIG. 27 is a perspective view showing the condition under which signals are picked up.

As shown in FIG. 27, to test the performance of the h-f circuit module 17', a probe 23' connected to a measuring instrument 21' via a h-f cable 22' is inserted into an opening 16' of the h-f switch 10' in a direction perpendicular to the board. As a result, signals are not transmitted from the signal conductor 19' to the signal conductor 20'. Under such a switching condition, the value of signals transmitted to the signal conductor 20' is substantially zero. The signals are transmitted from the signal conductor 19' to the measuring instrument 21' through the switching spring 14', the probe 23', and the h-f cable 22'. Under this condition, the h-f switch 10' has an impedance match in the form of so-called side edge transmission line in a signal transmission line which includes the signal conductor 19', the switching spring 14', the probe 23', and the h-f cable 22'. Consequently, the value of signals reflected at the h-f switch 10' is substantially zero so that the values of signals input from the signal conductor 19' and output to the measuring instrument 21' through the h-f cable 22' are substantially equal.

With the h-f switch 10' it is possible to pick up signals in the direction normal to the board from various points on the board without taking large spaces. The h-f switch 10' does not disturb the impedance of a transmission line on which it is mounted, making it possible to pick up all of the signals running on the transmission line. Thus, it is very useful in accurate measurement and analysis (test of circuits) of signals which are too weak for conventional h-f switches to pick up.

The above h-f switch, however, relies on the so-called side edge transmission line mode and has the following disadvantages:

To keep the side edge transmission line mode for both the normal closed condition and the signal pick-up open condition of the switching spring, it is necessary to keep the height of the side edge transmission line under the normal closed condition to a certain level, making the height of the h-f switch larger. The smallest height realized so far is 4 mm in this mode.

There is an increasing demand for a lower profile h-f switch having a height of 3 mm or less. However, it is difficult to meet this requirement by relying on the side edge transmission line mode.

In addition, in the side edge transmission line mode, the depression of the switching spring upon measurement lowers the h-f performance of the transmission line which is designed to be best in the normal closed condition.

According to the invention these problems are solved as follows.

In FIGS. 28–32, a h-f switch 100 having a coaxial connection portion for receiving a probe includes an insulating housing 110, a ground plate 120 attached to the insulating housing 110, a connection plate 130, and a switching spring 140.

The insulating housing 110, is molded from a plastic material so as to have a substantially rectangular body having a lower cavity 111 for receiving the switching spring 140 and an upper cylindrical recess 113 for receiving a ground conductive cylindrical portion 122 of the ground plate 120. Two pairs of grooves 115 and 115A are provided on opposite sides of the insulating housing 110 to receiving first and second ground conductive plate portions 123 and 124 of the ground plate 120. A circular through-hole 114 is provided at the center of the bottom of the cylindrical recess 113 of the housing 110. Provided on the right side wall of the housing 110 into the lower cavity 111 is a slot 112 into which an intermediate portion 132 of the connection plate 130 is press fitted. On the left side wall there are provided a pair of grooves 112D into which an extended section 144 of the intermediate portion 142 of the switching spring 140 is press fitted. A cutout portion 112A is provided on the lower right side of the housing 110 to receive a connection terminal 133 of the connection plate 130. A cutout portion 112B is provided on the lower left side of the housing 110 to receive a connection terminal 143 of the switching spring 140. Four cutout portions 112C are provided on the corners of the housing 110 to receive respective connection terminals 126 of the ground plate 120.

Figure 33:
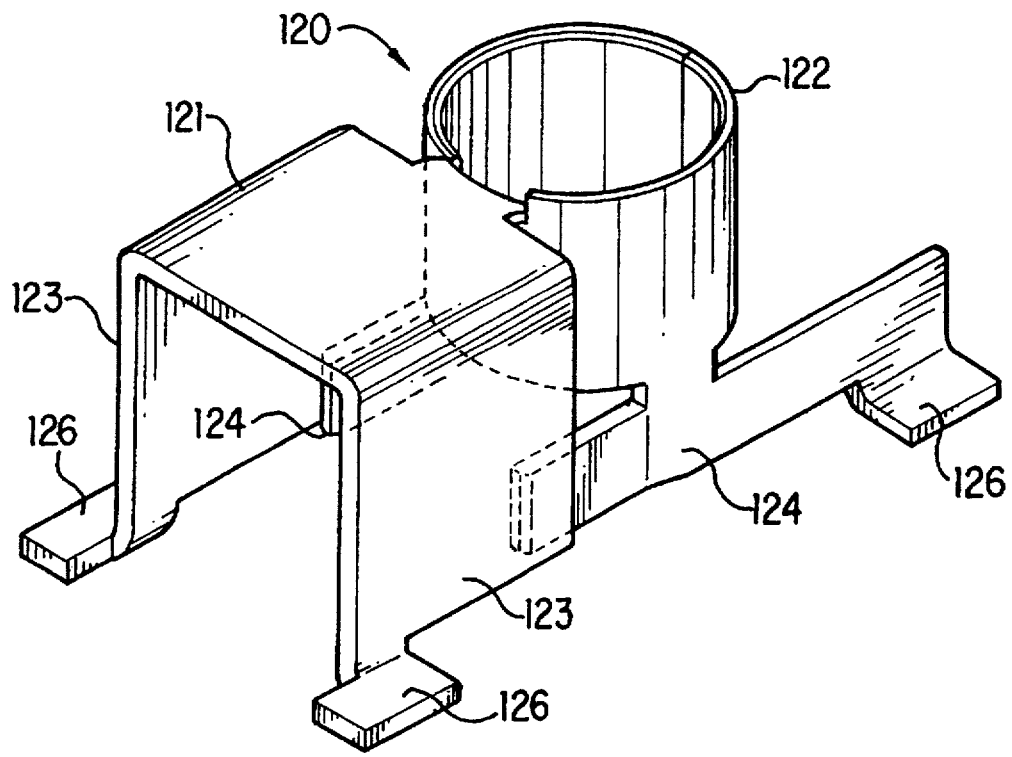
FIG. 33 is a perspective view of a ground plate for the h-f switch of FIG. 28.

In FIG. 33, the ground plate 120 is made by stamping and forming from a conductive metal sheet so as to have a ceiling portion 121, a pair of first ground conductive plate portions 123 extending downwardly from the ceiling portion 121, a ground conductive cylindrical portion 122 linked to the ceiling portion 132, and a pair of second round conductive plate portions 124 extending laterally from opposite lower end of the cylindrical portion 122. Two pairs of connection terminals 126 extends laterally from the lower ends of the first and second plate portions 123 and 124 for connection with ground conductors of the board.

Figure 31:
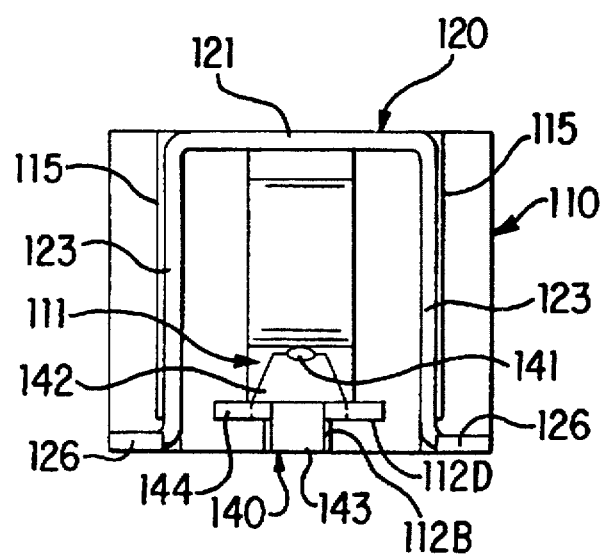
FIG. 31 is a right-hand side view of the h-f switch of FIG. 28.
Figure 32:
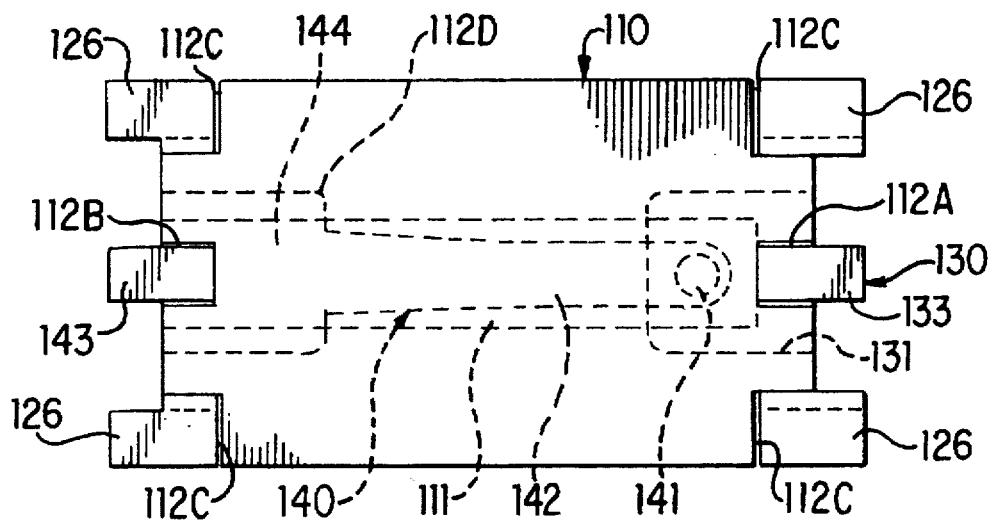
FIG. 32 is a bottom view of the h-f switch of FIG. 28.

The connection plate 130 is made by stamping and forming from a conductive metal sheet. It is a part of the non-ground conductive plate and has at a free end a contact portion 131 for contact with a contact portion of the switching spring 140 and a C-shaped intermediate portion 132 extending from the contact portion 131. A connection terminal 133 extends laterally from the lower end of the intermediate portion 132 for connection with a signal conductor of the board. As shown in FIGS. 31 and 32, the contact portion 131 of the connection plate 130 is made wider than the intermediate portion 132.

Figure 30:
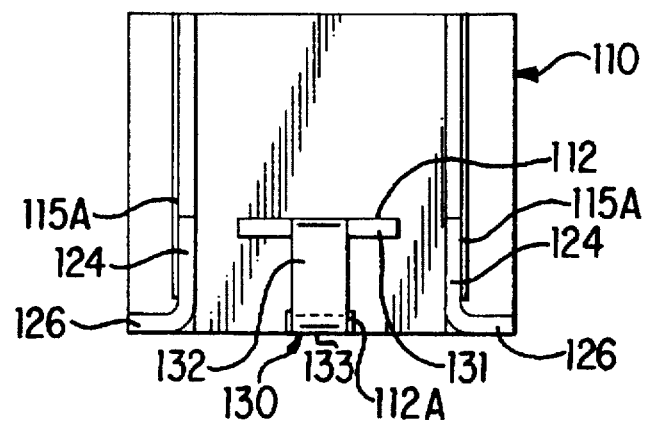
FIG. 30 is a left-hand side view of the h-f switch of FIG. 28.

The switching spring 140 is made by stamping and forming from a springy conductive metal sheet. It constitutes a part of the non-ground conductive plate and has at a free end a contact portion 141 for contact with the contact portion 131 of the connection plate 130 and an elongated intermediate portion 142 extending from the contact portion 141. As shown in FIGS. 30 and 32, the base section of the intermediate portion 142 has an extended portion 144 disposed on the bottom of the cavity 111 of the housing 110. A signal terminal 143 extends downwardly and then laterally from the extended portion 144 for connection with a signal conductor of the board. Alternatively, the switching spring 140 may be made by using a flexible printed circuit board (FPC) for reducing the costs. The FPC may be molded with or connected to the insulating housing 110.

Figure 28:
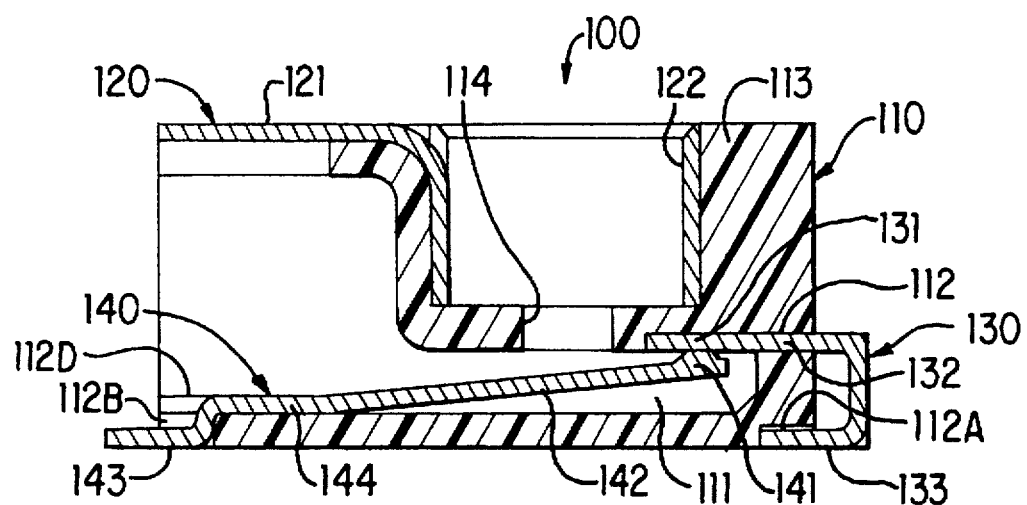
FIG. 28 is a sectional view of a h-f switch according to yet another embodiment of the invention.
Figure 29:
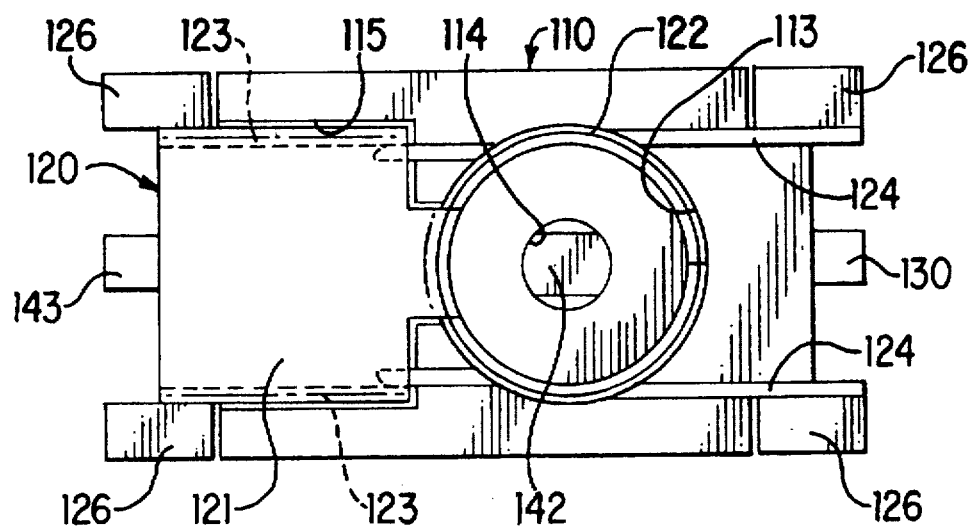
FIG. 29 is a top plan view of the h-f switch of FIG. 28.

The h-f switch 100 is assembled as follows. First, as shown in FIG. 28, the connection plate 130 and the switching spring 140 are press fitted into the insulating housing 110 such that the contact portion 131 of connection plate 130 depresses the upper face of the contact portion 141 of switching spring 140. Consequently, the contact portion 141 of switching spring 140 is biased downwardly against its spring force. Then, the ground plate 120 is attached such that the first and second ground conductive plate portions 123 and 124, the cylindrical portion 122, and the connection terminals 126 are fitted into respective grooves 115 and 115A, cylindrical recess 113, and cutouts 112C.

As shown in FIG. 28, the contact portions 131 and 141 of connection plate 130 and switching spring 140 are normally in contact with each other so that signals are transmitted from the connection terminals 143 to the connection terminal 133. When a probe is inserted through the cylindrical portion 122 of ground plate 120 and the opening 114 of insulating housing 110, the intermediate portion 142 of the switching spring 140 is depressed downwardly by the probe so that the contact portion 141 is separated from the contact portion 131 of the connection plate 130. Consequently, signals are transmitted from the connection terminal 143 to the probe. When the probe is removed, the switching spring 140 returns to the original position so that the contact portion 141 is urged against the contact portion 131 of the connection plate 130.

Figure 34:
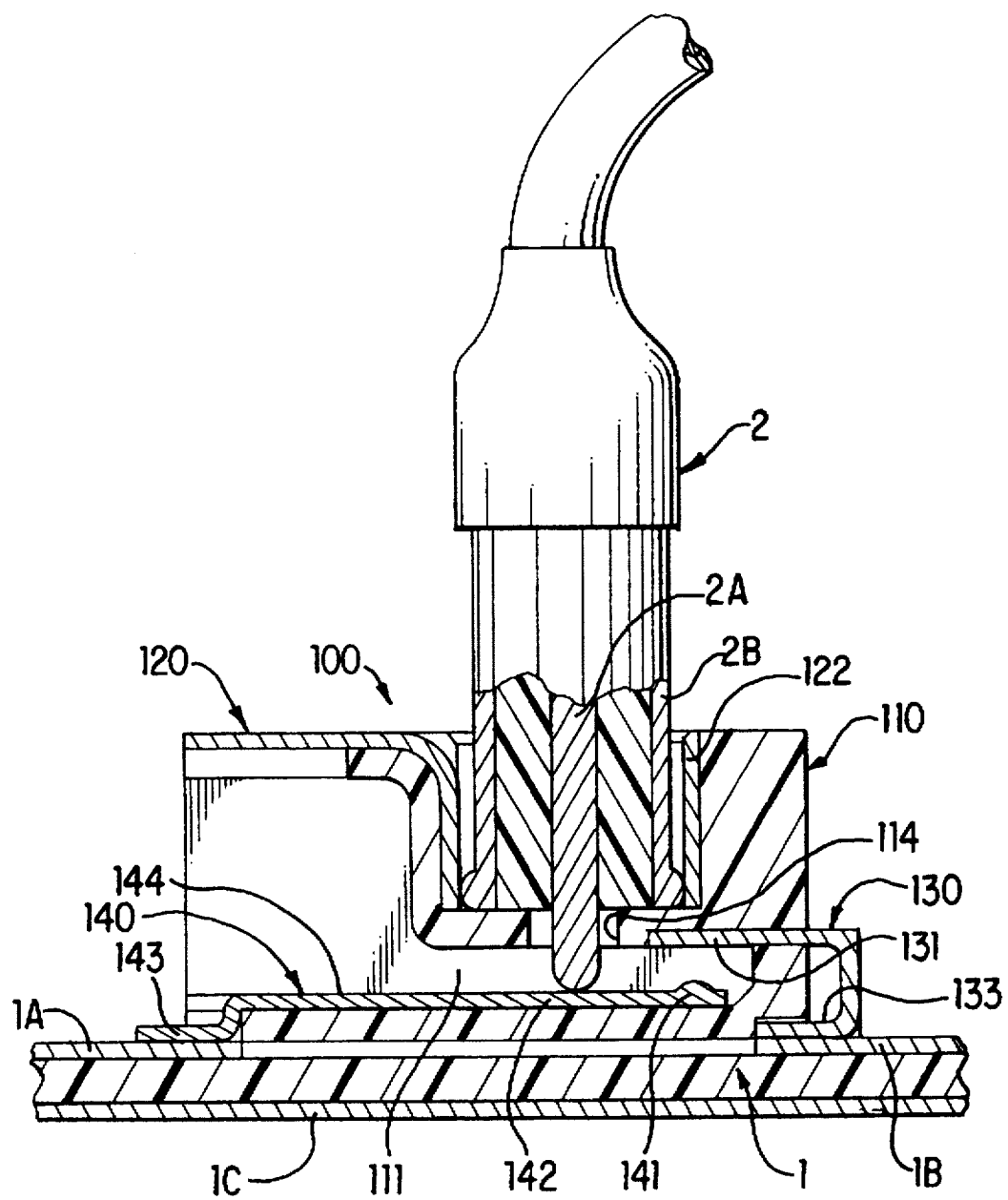
FIG. 34 is a side view, partially in section, of the h-f switch mounted on a board, into which a probe is inserted.

How to use the h-f switch 100 will be described in more details with reference to FIG. 34, which shows that an ordinary coaxial connector plug 2 connected to a coaxial cable is inserted into the h-f switch 100 mounted on a h-f circuit board 1 on which the signal conductor 1A of an input side h-f circuit and the signal conductor 1B of an output side h-f circuit or element as well as ground conductors (not shown) are disposed. A copper film 1C is disposed on the back side of the board 1. The h-f switch 100 is disposed between the signal conductors 1A and 1B such that the connection terminals 143 and 133 of switching spring 140 and connection plate 130 are soldered to the signal conductors 1A and 1B respectively. The connection terminals 126 of first and second ground plate portions 123 and 124 of ground plate 120 are soldered to the ground conductors of the board 1.

The normal condition under which the coaxial connector plug 2 is not inserted in the opening 114 is shown in FIG. 28. That is, the contact portion 141 of switching spring 140 is in contact with the contact portion 131 of connection plate 130 so that the h-f switch 100 has an impedance match in a signal transmission line from the signal conductor 1A to the signal conductor 1B through the switching spring 140 and the connection plate 130. Consequently, the value of reflected signals is substantially zero, and the value of signals output on the signal conductor 1B is substantially equal to the value of signals input from the signal conductor 1A. The impedance match is achieved by designing the circuits such that signals are transmitted on a microstrip transmission line formed between the extended section 144 of the intermediate portion 142 and the copper film 1C or a coplanar guide transmission line formed by coplanar guide conductors made on the upper side of the board 1 and a side edge transmission line formed between a portion between the extended section 144 and the contact portion 141 and the first and second ground conductive plate portions 123 and 124.

To test the performance of h-f circuits, the coaxial connector plug 2 is inserted through the through-hole 114 in a direction normal to the board 1. The outer conductor 2B of the connector plug 2 is brought into contact with the cylindrical portion 122 while the central conductor 2A depresses the switching spring 140 downwardly against the spring force so that the contact portion 141 of the switching spring 140 is separated from the contact portion 131 of the connection plate 130. Consequently, signals are no longer transmitted from the signal conductor 1A to the signal conductor 1B. That is, under the switching condition, the value of signals output on the signal conductor 1B is substantially zero. The signals on the signal conductor 1A are picked up through the switching spring 140, the central conductor 2A of the connector plug 2. Under this condition, the h-f switch 100 has an impedance match so that the value of signals on the signal conductor 1A is substantially equal to the value of signals picked up on the central conductor 2A of the connector plug 2. It is designed that when depressed by the probe 2, the whole intermediate portion 142 of the switching spring 140 is pressed against the bottom of the cavity 111 of the insulating housing 110 so that it is brought to a close and parallel position to the copper film 1C. Thus, signals are transmitted on a microstrip transmission line formed between the whole intermediate portion 142 of switching spring 140 and the copper film 1C on the back side or a coplanar guide transmission line formed between coplanar guide conductors if they are disposed on the upper side of the board 1.

By designing that signals are transmitted on a side edge transmission line under the normal condition and a microstrip or coplanar transmission line under the switching condition, the height of a h-f switch can be reduced to 3 mm or less.

FIGS. 35–39 show another embodiment of the invention, wherein a h-f switch 200 includes an insulating housing 210, a ground plate 220 attached to the housing 210, a connection plate 230, and a switching spring 240.

The insulating housing 210 is molded from a plastic material so as to have a lower cavity 211 for receiving the switching spring 240, and upper circular hole 214 in alignment with a circular hole 222 of the ground plate 220. A pair of grooves 215 are provided on opposite sides of the housing 210 for receiving ground conductive plates 224 of the ground plate 220. A slot 212 is provided in a side wall of the insulating housing 210 for receiving the intermediate portion 232 of the connection plate 230. A pair of grooves 212D are provided on opposite side walls of the insulating housing 210 for receiving the extended section 244 of the intermediate portion 242. Cutouts 212A and 212B are provided on the bottom of the housing 210 for receiving the connection terminal 233 and 243 of the connection plate 230 and the switching spring 240, respectively. Four cutouts 212C are provided at the corners of the bottom for receiving respective connection terminals 226 of the ground plate 220.

Figure 40:
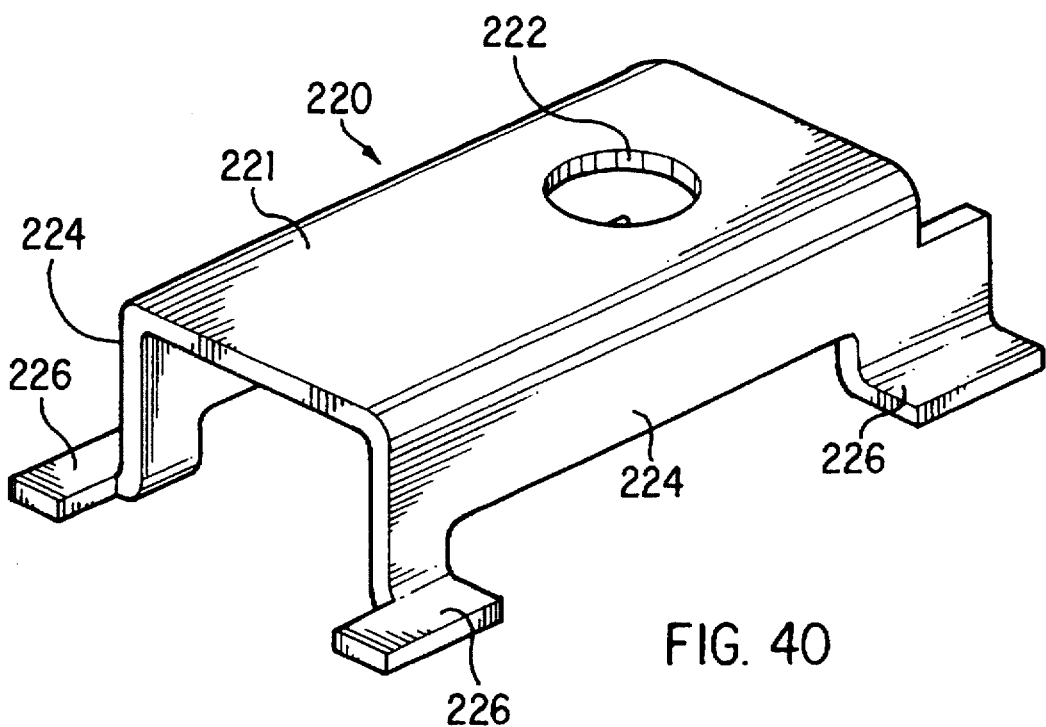
FIG. 40 is a perspective view of a ground plate for the h-f switch of FIG. 35.

As shown in FIG. 40, the ground plate 220 is made by stamping and forming from a conductive metal sheet so as to have a ceiling portion 221, and a pair of parallel ground plate portions 224 extending downwardly from the ceiling portion 221. A circular hole 222 is provided in the ceiling portion 221 for receiving a probe. Four connection terminals 226 extend laterally from the lower ends of the ground plate portions 224 for connection with ground conductors of the board.

Figure 38:
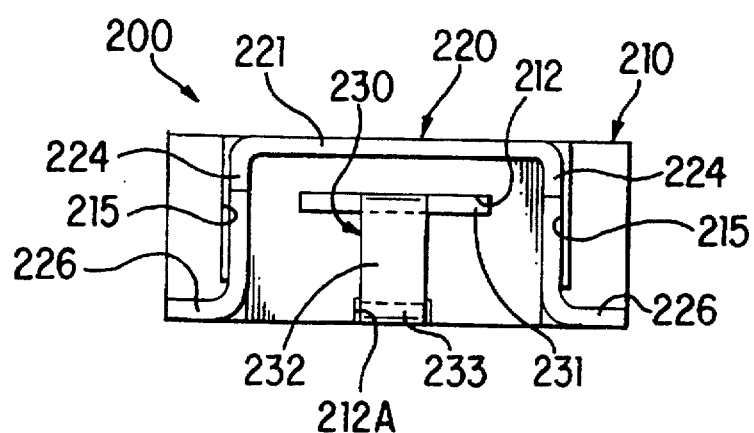
FIG. 38 is a right-hand side view of the h-f switch of FIG. 35.
Figure 39:
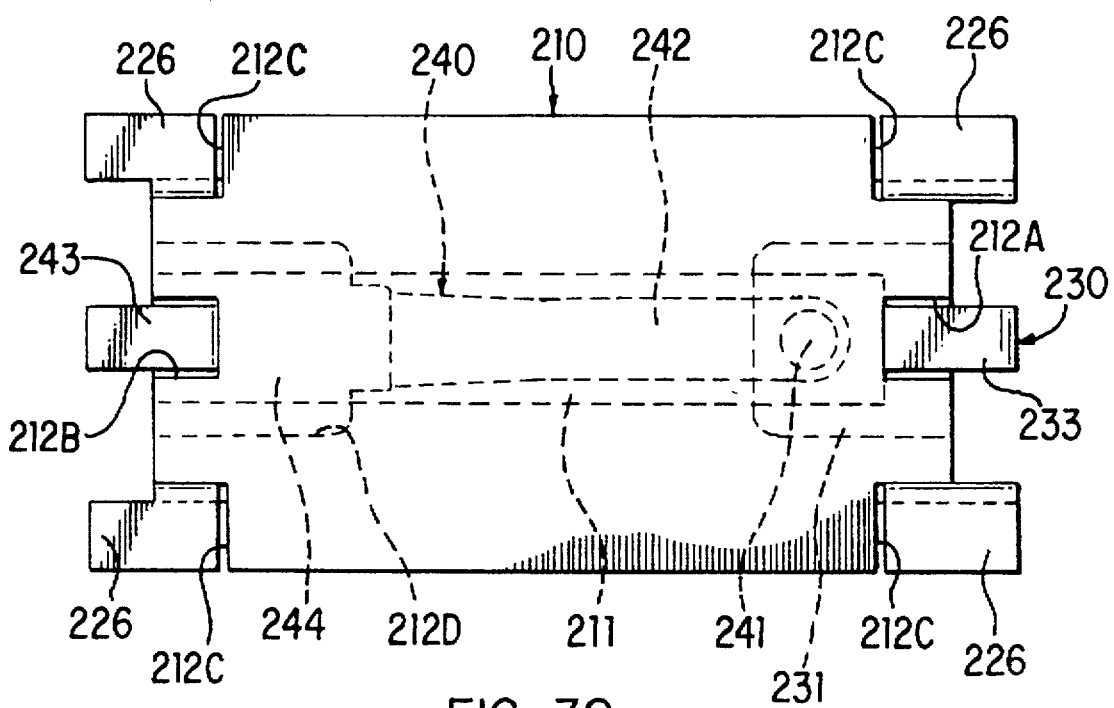
FIG. 39 is a bottom view of the h-f switch of FIG. 35.

In FIGS. 38 and 39, the connection plate 230 is made by stamping and forming from a conductive metal sheet. It is a part of the non-ground conductive plate and has a contact portion 231 for contact with the contact portion of the switching spring 240 and a C-shaped intermediate portion 232 linked to the contact portion 231. A connection terminal 233 extends laterally from the lower end of the intermediate portion 223 for connection to a signal conductor of the board. The contact portion 231 of the connection plate 230 is made wider than the intermediate portion 232.

Figure 37:
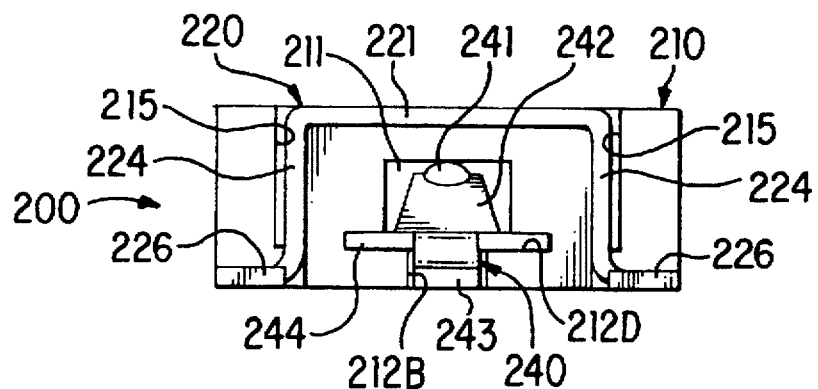
FIG. 37 is a left-hand side view of the h-f switch of FIG. 35.

In FIGS. 37 and 39, the switching spring 240 is made by stamping and forming a springy conductive metal sheet. It is a part of the non-ground conductive plate and has a contact portion 241 for contact with the contact portion 231 of the connection plate 230 and an elongated intermediate portion 242 extending from the contact portion 241. The intermediate portion 242 has an extended base 244 which is disposed on the bottom of the lower cavity 211 of he housing 210. A connection terminal 243 extends laterally from the extended base 244 for connection to a signal conductor of the board. Alternatively, the switching spring may be made from a flexible printed circuit board (FPC) to reduce the costs. The FPC may be molded with or bonded to the insulating housing 210.

Figure 35:
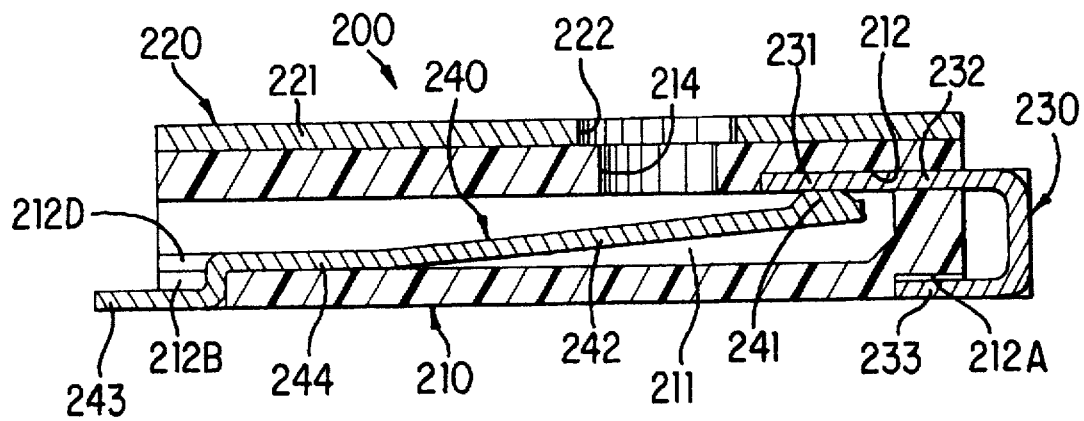
FIG. 35 is a sectional view of a h-f switch according to another embodiment of the invention.
Figure 36:
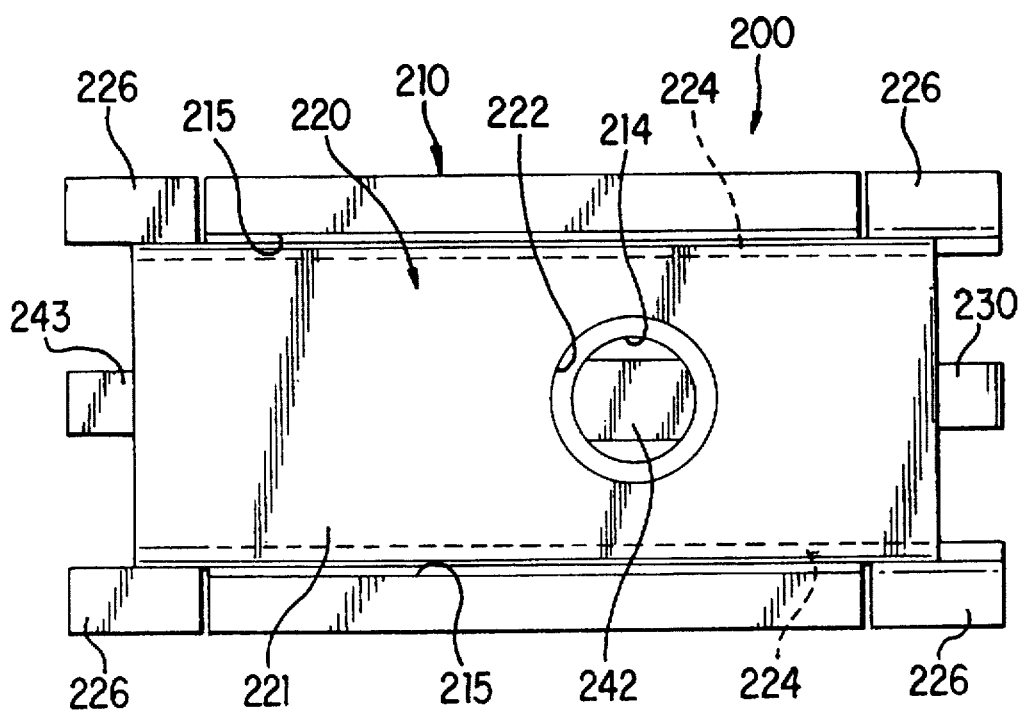
FIG. 36 is a top plan view of the h-f switch of FIG. 35.

How to assemble the h-f switch 200 will be described briefly. First, as shown in FIG. 35, the connection plate 230 and the switching spring 240 are attached to the insulating housing 210 such that the contact portion 241 of the switching spring 240 is brought into contact with the back of the contact portion 231 of the connection plate 230. Then, the ground plate 220 is attached such that the ground plate portions 224 and the connection terminals 226 are fitted in the grooves 215 and the cutouts 212C, respectively, while the circular hole 222 of the ground plate 220 is aligned with the circular hole 214 of the insulating housing 210.

Under the normal condition, the contact portions 231 and 241 of connection plate 230 and switching spring 240 are in contact with each other so that signals are transmitted from the connection terminal 243 to the connection terminal 233. To test h-f circuits, a probe is inserted through the circular holes 222 and 214 of the ground plate 220 and insulating housing 210, respectively. Unlike the ordinary coaxial connector plug used for the embodiment of FIGS. 28–34, it is preferred to use the so-called top touch coaxial connector plug for this embodiment. The top touch coaxial connector plug has an outer conductor which retreats against biases with respect to the central conductor when the plug is inserted into the jack.

When such a top touch coaxial connector plug is inserted into the circular holes 222 and 214, the outer conductor is abutted against the periphery of the circular hole 222 of the ground plate 220 so that only the central conductor passes through the circular holes 222 and 214 (with the outer conductor moved backwardly with respect to the central conductor). The central conductor then depresses the intermediate portion 242 of the switching spring 240 so that the contact portion 241 is separated from the contact portion 231, transmitting signals from the connection terminal 243 to the central conductor of the connector plug. When the coaxial plug is removed, the switching spring returns to the original position so that the contact portion 241 is urged against the contact portion 231 of the connection plate 230.

How to use the h-f switch 200 is substantially the same as the use of the h-f switch 100 except for the top touch coaxial connector plug, and the description will be omitted. The h-f switch 200 has no such elements as cylindrical recess 113 and cylindrical portion 122 of the h-f switch 100 and meets the very low profile requirement.

As described above, the h-f switch according to the invention satisfies the low profile requirement yet maintains the satisfactory h-f characteristics for both the normal condition and the switching condition under which signals are picked up.

We claim:

1. A method of testing a performance of each of high frequency circuits made on a board of a high frequency apparatus, comprising the steps of:

disposing in at least one of said high frequency circuits a high frequency switch having a non-ground conductive plate which is switched between a first condition under which a signal is picked up in a direction parallel to said board and a second condition under which a signal is picked up in a direction perpendicular to said boards;

depressing said non-ground conductive plate with a probe to said second condition for testing a performance of said one of high frequency circuits; and releasing, after testing, said probe from said non-ground conductive plate so that said non-ground conductive plate springs back to said first condition.

2. A method of testing according to claim 1, wherein said high frequency switch comprises:

an insulating housing to be mounted on said board;

a pair of parallel ground conductive plates disposed on opposite sides of said insulating housing in a direction perpendicular to said board such that when said insulating housing is mounted on said board, said ground plates are connected to said ground conductors;

said non-ground conductive plate disposed in said insulating housing between and at right angles with said parallel ground conductive plates such that when said insulating housing is mounted on said board, said non-ground conductive plate is connected to said signal conductors, said non-ground conductive plate including:

a leaf spring contact to be connected one of said signal conductors on an input side, and a connection plate to be connected one of said signal conductors on an output side;

a free end of said leaf spring contact being pressed against a free end of said connection plate by a spring force in a direction perpendicular to said board but, when a probe is inserted in a direction perpendicular to said board to depress said leaf spring contact, said free end of said leaf spring contact being separated from said free end of said connection plate so that incoming signals are transmitted to said probe from said one of said signal conductor.

3. A method of testing according to claim 1, wherein said high frequency switch comprises:

an insulating housing to be mounted on said board;

a pair of parallel ground conductive plates disposed on opposite sides of said insulating housing in a direction perpendicular to said board such that when said insulating housing is mounted on said board, said ground plates are connected to said ground conductors;

said non-ground conductive plate disposed in said insulating housing between and at right angles with said parallel ground conductive plates such that when said insulating housing is mounted on said board, said non-ground conductive plate is connected to said signal conductors, said non-ground conductive plate including:

an intermediate connection plate;

a first leaf spring contact to be connected one of said signal conductors on one side, and a second leaf spring contact to be connected to another of said signal conductors on the other side, free ends of said first and second leaf spring contacts being pressed against free ends of said intermediate connection plate by spring forces in a direction perpendicular to said board but, when a probe is inserted in a direction perpendicular to said board to depress one of said first and second leaf spring contacts, said free end of said one of said leaf spring contacts being separated from one of said free ends of said connection plate so that incoming signals are transmitted to said probe through said one of said first and second leaf spring contacts.

4. A method of testing according to claim 1, wherein said high frequency switch comprises:

an insulating housing to be mounted on said board;

a ground plate having a pair of parallel ground conductive plates portions disposed on opposite sides of said insulating housing such that when said insulating housing is mounted on said board, said ground conductive plate portions are perpendicular to said board and connected to said ground conductors;

said non-ground conductive plate disposed in said insulating housing between and at right angles with said parallel ground conductive plate portions such that when said insulating housing is mounted on said board, said non-ground conductive plate is connected to said signal conductors, said non-ground conductive plate including:

a connection plate to be connected to one of said signal conductors on an output side and having a free contact end portion; and a leaf spring contact to be connected one of said signal conductors on an input side and having a free spring contact end portion for spring contact with said free contact end portion of said connection plate so as to form a side edge transmission line together with said ground conductive plates but, when a probe is inserted in a direction normal to said board to separate said leaf spring contact end portion from said free contact end portion of said connection plate, it forms a microstrip or coplanar guide transmission line together with said conductive plane.

* * * * *